(12) United States Patent
Okada

(10) Patent No.: US 7,345,319 B2
(45) Date of Patent: Mar. 18, 2008

(54) LIGHT EMITTING DEVICE

(75) Inventor: Naotada Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/464,383

(22) Filed: Aug. 14, 2006

(65) Prior Publication Data
US 2007/0041191 A1 Feb. 22, 2007

(30) Foreign Application Priority Data
Aug. 16, 2005 (JP) ............... 2005-236006

(51) Int. Cl.
H01L 29/22 (2006.01)
H01L 29/227 (2006.01)
H01L 33/00 (2006.01)

(52) U.S. Cl. ............... 257/98; 428/690; 362/612; 257/E33.061

(58) Field of Classification Search ........ 257/E33.061, 257/98; 428/690; 362/612
See application file for complete search history.

(56) References Cited

U.S. PATENT DOCUMENTS

2003/0227249 A1* 12/2003 Mueller et al. ............. 313/491

2005/0142379 A1* 6/2005 Juni et al. ............... 428/690

FOREIGN PATENT DOCUMENTS

JP 2003-243727 8/2003
JP 2005-19663 1/2005

* cited by examiner

Primary Examiner—Minhloan Tran
Assistant Examiner—Eric A Bomkamp
(74) Attorney, Agent, or Firm—Oblon, Spivak, McClelland, Maier & Neustadt, P.C.

(57) ABSTRACT

A light emitting device of the present invention includes an LED substrate and a sealing resin portion which seals the LED substrate, the sealing resin portion having a silicone resin having a refractive index $n_3$ to which a fluorescent material having a refractive index $n_1$ and fine particles having a refractive index $n_2$ are added. In the light emitting device, a relationship of $n_2 > n_1 > n_3$ holds in the refractive indexes $n_1$ to $n_3$, and a particle size of the fine particles is not more than $1/10$ of a wavelength of light emitted from the LED substrate.

2 Claims, 2 Drawing Sheets

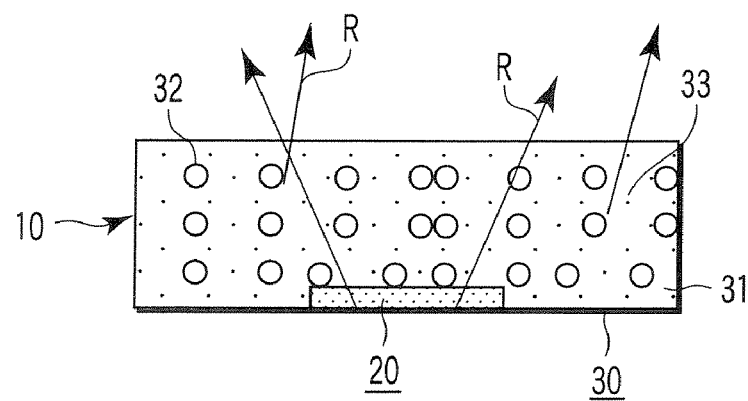
F I G. 1
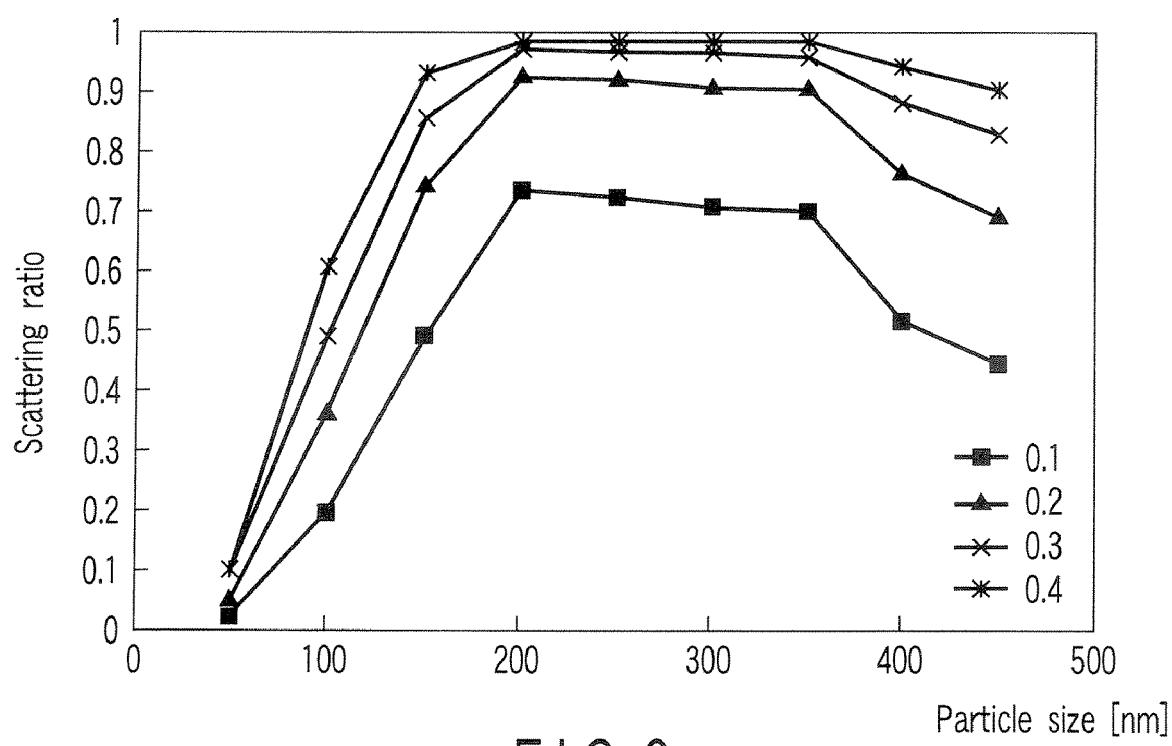
F I G. 2

LIGHT EMITTING DEVICE

CROSS-REFERENCE TO RELATED APPLICATIONS

This application is based upon and claims the benefit of priority from prior Japanese Patent Application No. 2005-236006, filed Aug. 16, 2005, the entire contents of which are incorporated herein by reference.

BACKGROUND OF THE INVENTION

1. Field of the Invention

The present invention relates to a light emitting device which can be used as various illuminating light sources, and particularly, to a light emitting device in which light extraction efficiency is improved.

2. Description of the Related Art

An LED lamp (light emitting device) in which an LED (light emitting diode) is used can be formed in a compact size with food electric power efficiency and the LED lamp emits bright color light with long life. Furthermore, the LED lamp has vibration-resistant property and is strong in a repeat of turn on/off. Therefore, the LED lamp is frequently used as various illuminating light sources (for example, refer to Jpn. Pat. Appln. KOKAI Publication No. 2005-19663).

FIG. 4 shows a conventional LED lamp. An LED lamp 100 includes an LED substrate 101 serving as a light emitting element and a sealing resin 102 made of silicone or the like for sealing the LED substrate 101. A fluorescent material 103 is mixed in the sealing resin 102, and various colors can be developed by combination of a color of the LED substrate 101 and a color of the fluorescent material 103.

In the conventional LED lamp, there is the following problem. The fluorescent material 103 for use in a white LED has a refractive index n ranging from 1.7 to 1.8. On the other hand, the sealing resin 102 in which the fluorescent material 103 is dispersed has a refractive index n ranging from 1.4 to 1.5. For this reason, the emitted light is scattered by the fluorescent material 103, the light impinges on a wall surface of a package or the fluorescent material 103 of itself many times, and light intensity is attenuated, which results in a decrease in light extraction efficiency.

In order to suppress the scattering of the fluorescent material 103, there is a method of forming the fluorescent material 103 having particle sizes not more than 50 nm. This is because, when the fluorescent material 103 is formed in the particle sizes not more than 50 nm, the scattering is hardly generated even if the difference in refractive index is generated. There is also a method of decreasing the difference in refractive index between the sealing resin and the fluorescent material to suppress the scattering with a resin such as epoxy having the high refractive index instead of silicone. There is also a method in which the resin is not used but the fluorescent material is used by sintering the fluorescent material.

However, in the above methods, there are the following problems. That is, the highly efficient fluorescent material having the small particle size is hardly produced, the epoxy resin is easily degraded by heat or an ultraviolet ray compared with silicone, and the sintered body is hardly realized in a $Sr_2SiO_4$ material.

On the other hand, in a conventional LED lamp 110 shown in FIG. 5, usually the refractive index of the LED substrate 111 is higher than that of the sealing resin 112. As a consequence, in the light emitted from an active layer of the LED substrate 111, total reflection is generated at an interface between the LED substrate 111 and the sealing resin 112, which results in the problem that the light is confined in the LED substrate 111 to decrease the light extraction efficiency.

BRIEF SUMMARY OF THE INVENTION

In view of the foregoing, an object of the invention is to provide a light emitting device, in which the total reflection is suppress when light is outputted to a resin from a light emitting element substrate while light scattering is suppressed by a fluorescent material and thereby the light extraction efficiency can be improved.

In order to solve the problem and achieve the object, a light emitting device according to the invention is configured as follows.

A light emitting device according to one aspect of the invention comprises: a light emitting element substrate; and a sealing resin portion which seals the light emitting element substrate, the sealing resin portion having a resin to which a fluorescent material having a refractive index $n_1$ and fine particles having a refractive index $n_2$ are added, the resin having a refractive index $n_3$, wherein a relationship of $n_2 > n_1 > n_3$ holds in the refractive indexes $n_1$ to $n_3$, and a particle size of the fine particles is not more than 1/10 of a wavelength of light emitted from the light emitting element substrate.

A light emitting device according to another aspect of the invention comprises: a light emitting element substrate having a refractive index $n_4$; a sealing resin portion which seals the light emitting element substrate, the sealing resin portion having a resin to which fine particles having a refractive index $n_5$ are added, the resin having a refractive index $n_6$, wherein a relationship of $n_5 > n_6$ holds in the refractive indexes $n_5$ and $n_6$, and a volume ratio a of the fine particles to the resin satisfies $n_4^2 = a \cdot n_5^2 + (1-a) \cdot n_5^2$.

According to the invention, the total reflection is suppress when the light is outputted to the resin from the light emitting element substrate while the light scattering is suppressed by the fluorescent material. Therefore, the light extraction efficiency can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a vertical sectional view schematically showing an LED lamp according to a first embodiment of the invention;

FIG. 2 shows a relationship between a scattering ratio and a particle size;

DETAILED DESCRIPTION OF THE INVENTION

Figure 3:
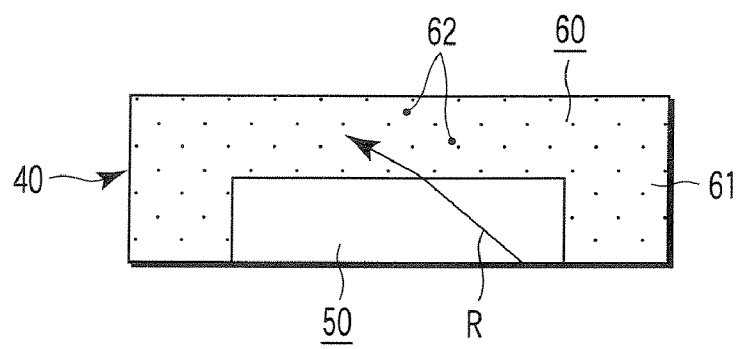
FIG. 3 is a vertical sectional view schematically showing an LED lamp according to a second embodiment of the invention.
Figure 4:
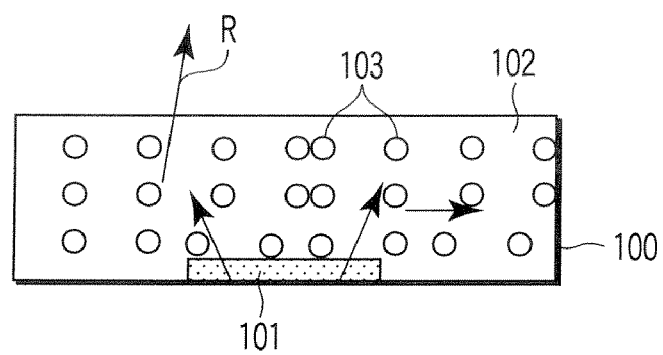
FIG. 4 is a vertical sectional view schematically showing a conventional LED lamp.
Figure 5:
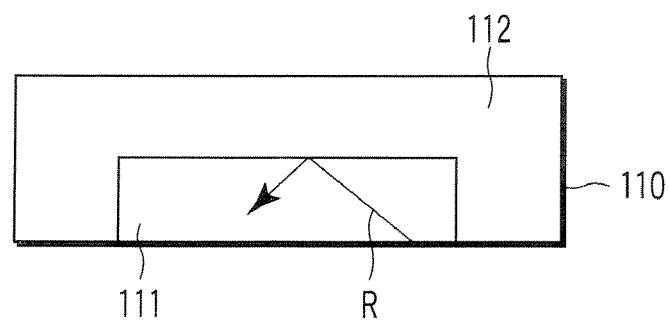
FIG. 5 is a vertical sectional view schematically showing a conventional LED lamp.

FIG. 1 shows an LED lamp (light emitting device) 10 according to a first embodiment of the invention. The LED lamp 10 includes an LED substrate (light emitting element substrate) 20 and a sealing resin portion 30 which seals the LED substrate 20. The LED substrate 20 is formed by a sapphire substrate (refractive index is 1.77). In the LED substrate 20, an InGaN active layer emits a blue light having a wavelength of 460 to 480 nm or an ultraviolet ray having a wavelength of 360 to 400 nm. The sealing resin portion 30 is formed by a silicone resin 31, a fluorescent material 32, and a fine particle 33. The fluorescent material 32 is added to the silicone resin 31.

The fluorescent material 32 includes a $Eu:Sr_2SiO_4$ or Ce:YAG fluorescent material having a diameter of 1 to 10 μm, and the fine particle 33 includes $TiO_2$ (titanium oxide) having a diameter of 30 nm. A refractive index $n_1$ of the fluorescent material 32 ranges from about 1.7 to about 1.8, and a refractive index $n_3$ of silicone resin used in sealing the LED (light emitting element) usually ranges from 1.4 to 1.5.

In order to eliminate the light scattering to improve the light extraction efficiency of the white LED, the fine particles 33 are used to bring the refractive index of the sealing resin portion 30 close to the refractive index of the fluorescent material 32. That is, because the refractive index of the resin in itself is hardly increased and brought close to the refractive index of the fluorescent material 32, the effective refractive index is increased by dispersing the fine particles 33 having a high refractive index in the silicone resin 31 having a low refractive index.

A refractive index $n_0$ of the sealing resin portion 30 having the fine particles 33 dispersed therein is expressed by $n_0^2 = a \cdot n_2^2 + (1-a) \cdot n_3^2$, where "a" is a volume ratio of the fine particles 33 to the silicone resin 31, $n_2$ is a refractive index of the fine particle, and $n_3$ is a refractive index of the silicone resin 31.

On the other hand, the light scattering is increased as the particle size of the fine particle 33 becomes larger. For this reason, it is necessary that the fine particle 33 is formed in the sufficiently smaller particle size when compared with the light wavelength of 400 to 800 nm. Specifically, the particle size of the fine particle 33 is formed not more than 50 nm, and desirably in the range of 10 to 20 nm. This is because as shown in FIG. 2, when the size of the fine particle (refractive index $n_2$) dispersed in the silicone resin (refractive index $n_3$) is not more than 50 nm, the scattering for the visible light is eliminated at the particle boundary in the sealing resin portion 30, and the sealing resin portion 30 apparently exhibits characteristics as a bulk material in which a bulk resin and the fine particles 33 are mixed. In FIG. 2, a thickness of the sealing resin portion 30 is 600 nm, the light wavelength is wavelength 500 nm, and data is obtained in the case where the volume ratio a ranges from 0.1 to 0.4.

In this case, the refractive index $n_0$ of the bulk material, i.e., the whole of the sealing resin portion 30 becomes $n_0 = \sqrt{(a \cdot n_2^2 + (1-a) \cdot n_3^2)}$, where "a" is a volume ratio of the fine particle 33 to the silicone resin 31. When the refractive index $n_0$ of the bulk material is equalized to the refractive index $n_1$ of the fluorescent material 32, the light extraction efficiency is improved because the scattering is not generated. Accordingly, in order to improve the light extraction efficiency, it is necessary to satisfy both the conditions of $n^{12} = a \cdot n_2^2 + (1-a) \cdot n_3^2$ and $n_2 > n_1 > n_3$.

When $TiO_2$ (refractive index $n_2 = 2.7$) is used as the fine particle 33 while silicone (refractive index $n_3 = 1.44$) is used as the resin, $n_x = 1.8$ for a=0.22. When Ce:YAG ($n_1 = 1.8$) is used as the fluorescent material 32, the scattering caused by the fluorescent material 32 can be suppressed at a minimum.

Furthermore, a difference in refractive index is small between the LED substrate 20 (refractive index 1.77) and the sealing resin portion 30 (refractive index 1.8), so that a reflection generated between the LED substrate 20 and the sealing resin portion 30 can also be suppressed at a minimum.

Thus, according to the LED lamp 10 of the first embodiment, the scattering caused by the fluorescent material 32 can be suppressed at a minimum in the sealing resin portion 30, and the reflection generated between the LED substrate 20 and the sealing resin portion 30 can also be suppressed at a minimum. As a consequence, the light extraction efficiency to the outside from the LED substrate 20 can be increased. Furthermore, because the refractive index is adjusted by adding the fine particle to the resin, the production cost is low and the technical difficulty is also low.

FIG. 3 is a vertical sectional view schematically showing an LED lamp 40 according to a second embodiment of the invention. The LED lamp 40 includes an LED substrate 50 and a sealing resin portion 60 which seals the LED substrate 50. The LED substrate 50 is formed by a sapphire substrate (refractive index $n_4 = 1.77$). In the LED substrate 50, a InGaN active layer emits a blue light having a wavelength of 460 to 480 nm or an ultraviolet ray having a wavelength of 360 to 400 nm. The sealing resin portion 60 is formed by a silicone resin 61, a fluorescent material 62, and a fine particle 63. The fluorescent material 62 is added to the silicone resin 61. The fine particle 62 is made of $TiO_2$ having the diameter of 30 nm.

When the size of the fine particle 62 (refractive index $n_5$) dispersed in the silicone resin 61 (refractive index $n_6$) is not more than 50 nm, the scattering for the visible light is eliminated at the particle boundary, and the sealing resin portion 60 apparently exhibits the characteristics as the bulk material in which the bulk resin and the fine particles are mixed. In this case, a refractive index $n_y$ of the bulk material, becomes $n_y^2 = (a \cdot n_5^2 + (1-a) \cdot n_6^2)$, where "a" is a volume ratio.

When the refractive index $n_y$ of the bulk material, i.e., the sealing resin portion 60 is approximated to the refractive index $n_4$ (=1.77) of the LED substrate 50, the light extraction efficiency to the sealing resin portion 60 from the LED substrate 50 is improved because the total reflection is eliminated at the interface between the LED substrate 50 and the sealing resin portion 60. Accordingly, in order to improve the light extraction efficiency, it is necessary to satisfy both the conditions of $n_4^2 = a \cdot n_5^2 + (1-a) \cdot n_5^2$ and $n_5 > n_6$.

In the case where $TiO_2$ (refractive index $n_5 = 2.7$) having the particle size of 30 nm is used as the fine particle 62 while silicone (refractive index $n_6 = 1.44$) is used as the resin, the refractive index $n_y$ of the sealing resin portion 60 can be set at 1.77 by setting the volume concentration of the fine particle 62 at 20% (a=0.2). Therefore, the refractive index $n_y = 1.77$ of the sealing resin portion 60 is approximated to the refractive index $n_4$ of the LED substrate 50.

Thus, according to the LED lamp 40 of the second embodiment, the reflection generated between the LED substrate 50 and the sealing resin portion 60 can also be suppressed at a minimum by decreasing the difference in refractive index between the LED substrate 50 (refractive index is 1.77) and the sealing resin portion 60 (refractive index is 1.8). Furthermore, because the refractive index is adjusted by adding the fine particle to the resin, the production cost is low and the technical difficulty is also low.

In the above embodiments, $TiO_2$ is used as the fine particles 33 and 62. However, $ZrO_2$ (zirconium oxide), ZnO (zinc oxide), and $HfO_2$ (hafnium oxide) which have the refractive index of 2.0 and $Al_2O_3$ (aluminum oxide) having a refractive index of 1.7 may be used as the fine particles 33 and 62.

The invention is not limited to the above embodiments, but various modifications could be made without departing from the scope and spirit of the invention. Various modifications and changes could be made by appropriately combining the plural components disclosed in the embodiments. For example, some components may be removed from all the components shown in the embodiments. The components in the embodiments may appropriately be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light emitting device comprising:

a light emitting element substrate; and a sealing resin portion which seals the light emitting element substrate, the sealing resin portion having a resin to which a fluorescent material having a refractive index $n_1$ and fine particles having a refractive index $n_2$ are added, the resin having a refractive index $n_3$, wherein a relationship of $n_2 > n_1 > n_3$ holds in the refractive indexes $n_1$ to $n_3$, a particle size of the fine particles is not more than 1/10 of a wavelength of light emitted from the light emitting element substrate and wherein a volume ratio "a" of the fine particles to the resin satisfies $n_1^2 = a \cdot n_2^2 + (1-a) \cdot n_3^2$.

2. A light emitting device comprising:

a light emitting element substrate having a refractive index $n_4$;

a sealing resin portion which seals the light emitting element substrate, the sealing resin portion having a resin to which fine particles having a refractive index $n_5$ are added, the resin having a refractive index $n_6$, wherein a relationship of $n_5 > n_6$ holds in the refractive indexes $n_5$ and $n_6$, and a volume ratio "a" of the fine particles to the resin satisfies $n_4^2 = a \cdot n_5^2 + (1-a) \cdot n_5^2$.

* * * * *